US007088272B2

United States Patent
Nomura

(10) Patent No.: US 7,088,272 B2
(45) Date of Patent: Aug. 8, 2006

(54) PIPELINE ARITHMETIC CODE DECODING METHOD AND APPARATUS USING CONTEXT INDEX PREDICTOR

(75) Inventor: Shuou Nomura, Kamagaya (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/166,080

(22) Filed: Jun. 27, 2005

(65) Prior Publication Data

US 2006/0022848 A1 Feb. 2, 2006

(30) Foreign Application Priority Data

Jul. 15, 2004 (JP) ............................. 2004-208446

(51) Int. Cl.
*H03M 7/00* (2006.01)

(52) U.S. Cl. ...................... 341/107; 341/108

(58) Field of Classification Search ......... 341/107–110
See application file for complete search history.

(56) References Cited

U.S. PATENT DOCUMENTS

| 5,589,829 A | * | 12/1996 | Astle | ............................ 341/106 |
| 5,654,702 A | * | 8/1997 | Ran | ............................ 341/107 |
| 5,867,600 A | * | 2/1999 | Hongu | ........................ 382/247 |
| 6,677,869 B1 | * | 1/2004 | Horie | ........................ 341/107 |
| 6,864,813 B1 | * | 3/2005 | Horie | ........................ 341/107 |

FOREIGN PATENT DOCUMENTS

| JP | 2000-350043 | 12/2000 |
| JP | 2001-189661 | 7/2001 |
| JP | 2002-33925 | 1/2002 |

* cited by examiner

*Primary Examiner*—Lam T. Mai
(74) *Attorney, Agent, or Firm*—Oblon, Spivak, McClelland, Maier & Neustadt, P.C.

(57) ABSTRACT

An arithmetic code decoding apparatus including a context index predictor which predicts a context index, a pipeline arithmetic code decoder which executes a decoding process of the bitstream using the predicted context index and outputs a decoded symbol based on prediction, a context index generator which receives the previous decoded symbols, the syntax element, and context information of the bitstream, and generates a correct context index, a binarization table searcher which searches the binarization table using the decoded symbol for a value of the syntax element, and a prediction failure detector which outputs a prediction failure signal when the two context indices do not match, wherein when the prediction failure signal is output, the pipeline arithmetic code decoder flashes the decoding process executed using the predicted context index, re-executes a decoding process using the correct context index, and outputs a correct decoded symbol.

17 Claims, 13 Drawing Sheets

SYMBOL NUMBER

```
┌ 0 A(0) → B(0) → C(0) → D(0)
│      A(5) → B(5) → C(5) → D(5)
├ 1
│      A(7) → B(7) → C(7) → D(7)
│           A(8) → B(8) → C(8) → D(8)
│           A(10)→ B(10)→ C(10)→ D(10)
├ 2         A(4) → B(4) → C(4) → D(4)
│           A(6) → B(6) → C(6) → D(6)
│                A(11) → B(11) → C(11) → D(11)
│                A(12) → B(12) → C(12) → D(12)
│                A(16) → B(16) → C(16) → D(16)
├ 3              A(14) → B(14) → C(14) → D(14)
│                ⎧A(13) → B(13) → C(13) → D(13)
│    UNNECESSARY⎨A(10) → B(10) → C(10) → D(10)
│                ⎪A(17) → B(17) → C(17) → D(17)
│                ⎩A(9)  → B(9)  → C(9)  → D(9)
┆
```

FIG. 5

| CONTEXT INDEX OUTPUT ONE CYCLE BEFORE | PREDICTED CONTEXT INDEX |
|---|---|
| 0 | 1 |
| 1 | 3 |
| 2 | 6 |
| 3 | 4 |
| 4 | 7 |
| 5 | 10 |
| 6 | 5 |
| 7 | 7 |
| 8 | 6 |
| 9 | 8 |
| 10 | 4 |
| ⋮ | ⋮ |

FIG. 6

| SYNTAX ELEMENT | DECODED SYMBOL NUMBER (binI dx) | PREDICTED CONTEXT INDEX |
|---|---|---|
| 0 | 0 | 1 |
| 0 | 1 | 3 |
| 0 | 2 | 6 |
| 0 | 3 | 4 |
| 0 | 4 | 7 |
| 1 | 0 | 10 |
| 1 | 1 | 5 |
| 1 | 2 | 7 |
| 1 | 3 | 6 |
| 2 | 0 | 8 |
| 2 | 1 | 4 |
| . | . | . |
| . | . | . |
| . | . | . |

FIG. 7

| SYMBOL CYCLE → | | | | | | | | | | | | | | |
|---|---|---|---|---|---|---|---|---|---|---|---|---|---|---|
| SYMBOL NUMBER | 0 | 1 | 2 | 3 | 4 | 5 | 6 | 7 | 8 | 9 | 10 | 11 | 12 | 13 |
| 0 | RC(0) | P(0) | AD0(0) | AD1(0) | AD2(0) | AD3(0) | AD4(0) | RC(0) | O(0) | | | | | |
| 1 | AD4(1) | | P(1) | AD0(1) | AD1(1) | AD2(1) | AD3(1) | AD4(1) | RC(1) | O(1) | | | | |
| 2 | AD3(2) | | | P(2) | AD0(2) | AD1(2) | AD2(2) | AD3(2) | AD4(2) | RC(2) | O(2) | | | |
| 3 | AD2(3) | | | | P(3) | AD0(3) | AD1(3) | AD2(3) | AD3(3) | AD4(3) | RC(3) | P(3) | AD0(3) | AD1(3) |
| 4 | AD1(4) | | | | | P(4) | AD0(4) | AD1(4) | AD2(4) | AD3(4) | AD4(4) | | P(4) | AD0(4) |
| 5 | AD0(5) | | | | | | P(5) | AD0(5) | AD1(5) | AD2(5) | AD3(5) | | | P(5) |
| ... | ... | ... | ... | ... | ... | ... | ... | ... | ... | ... | ... | ... | ... | ... |

| P (i) | STAGE IN WHICH CONTEXT INDEX IS PREDICTED FOR i-TH SYMBOL |
|---|---|
| AD0 (i) ~ AD4 (i) | STAGES (FIVE STAGES) IN WHICH ARITHMETIC CODE IS DECODED USING PREDICTED CONTEXT INDEX FOR i-TH SYMBOL |
| RC (i) | STAGE IN WHICH ACTUAL CONTEXT INDEX IS OBTAINED USING OUTPUT FROM O(i-1) FOR i-TH SYMBOL, AND IT IS CHECKED IF CONTEXT INDEX PREDICTED IN P STAGE IS CORRECT |
| O (i) | STAGE IN WHICH DECODING RESULT IS OUTPUT FOR i-TH SYMBOL |

FIG. 9B

| RC (i) | STAGE IN WHICH PREDICTION FAILURE HAS OCCURRED |
|---|---|
| | CYCLE IN WHICH NO PROCESS IS DONE FOR i-TH SYMBOL DUE TO PREDICTION FAILURE |

| SYNTAX ELEMENT VALUE | DECODED SYMBOL SEQUENCE | | | | | | |
|---|---|---|---|---|---|---|---|
| 0 | 0 | | | | | | |
| 1 | 1 | 0 | 0 | 0 | 0 | 0 | |
| 2 | 1 | 0 | 0 | 0 | 0 | 1 | |
| 3 | 1 | 0 | 0 | 0 | 1 | 0 | |
| 4 | 1 | 0 | 0 | 0 | 1 | 1 | |
| 5 | 1 | 0 | 0 | 1 | 0 | 0 | 0 |
| 6 | 1 | 0 | 0 | 1 | 0 | 0 | 1 |
| 7 | 1 | 0 | 0 | 1 | 0 | 1 | 0 |
| 8 | 1 | 0 | 0 | 1 | 0 | 1 | 1 |
| 9 | 1 | 0 | 0 | 1 | 1 | 0 | 0 |
| 10 | 1 | 0 | 0 | 1 | 1 | 0 | 1 |
| 11 | 1 | 0 | 0 | 1 | 1 | 1 | 0 |
| 12 | 1 | 0 | 0 | 1 | 1 | 1 | 1 |
| 13 | 1 | 0 | 1 | 0 | 0 | 0 | |
| 14 | 1 | 0 | 1 | 0 | 0 | 1 | |
| 15 | 1 | 0 | 1 | 0 | 1 | 0 | |
| 16 | 1 | 0 | 1 | 0 | 1 | 1 | |
| 17 | 1 | 0 | 1 | 1 | 0 | 0 | 0 |
| 18 | 1 | 0 | 1 | 1 | 0 | 0 | 1 |
| 19 | 1 | 0 | 1 | 1 | 0 | 1 | 0 |
| 20 | 1 | 0 | 1 | 1 | 0 | 1 | 1 |
| 21 | 1 | 0 | 1 | 1 | 1 | 0 | 0 |
| 22 | 1 | 0 | 1 | 1 | 1 | 0 | 1 |
| 23 | 1 | 0 | 1 | 1 | 1 | 1 | 0 |
| 24 | 1 | 0 | 1 | 1 | 1 | 1 | 1 |
| 25 | 1 | 1 | | | | | |
| BIT POSITION (binIdx) | 0 | 1 | 2 | 3 | 4 | 5 | 6 |

FIG. 10

PIPELINE ARITHMETIC CODE DECODING METHOD AND APPARATUS USING CONTEXT INDEX PREDICTOR

CROSS REFERENCE TO RELATED APPLICATION

This application is based upon and claims benefit of priority under 35 USC § 119 from the Japanese Patent Application No. 2004-208446, filed on Jul. 15, 2004, the entire contents of which are incorporated herein by reference.

BACKGROUND OF THE INVENTION

The present invention relates to an arithmetic code decoding method and apparatus.

A decoding process of context-based adaptive arithmetic codes specified by the standard "H.264 Main Profile" requires considerable processing performance.

To decode one symbol requires a sequence of at least four steps. In addition, in order to obtain a context index required to decode an arithmetic code for a given symbol, the control must wait for completion of decoding of arithmetic codes for previous symbols, and it is difficult to increase the processing speed by pipelined parallel processes.

Other image-related processes can be speeded up by parallel processes. However, the decoding process of context-based arithmetic codes cannot be speeded up unless the operation frequency is raised.

Conventionally, arithmetic codes are used in JBIG (ITU recommendation T.82) or the like. As a circuit for pipelining and speeding up a circuit for decoding arithmetic codes, various proposals such as patent reference 1, patent reference 2 (to be described later), and the like have been made. These circuits adopt a scheme for simultaneously executing decoding processes of arithmetic codes for symbols using all possible context indices, and adopting a hit context index when a correct context index is determined.

Reference names associated with conventional arithmetic code decoding techniques are:

Patent Reference 1: Japanese Patent Laid-Open No. 2002-33925

Patent Reference 2: Japanese Patent Laid-Open No. 2000-350043

However, in a conventional decoding apparatus that simultaneously and parallelly processes all candidates, the circuit scale increases exponentially with increasing number of pipeline stages.

SUMMARY OF THE INVENTION

According to one aspect of the present invention, there is provided an arithmetic code decoding apparatus for generating a decoded symbol by decoding an input bitstream generated by encoding information, and outputting a value of a syntax element corresponding to the decoded symbol, comprising:

a context index predictor which receives the syntax element indicating a type of the information included in the bitstream, predicts a context index required to decode the bitstream, and outputs the predicted context index;

a pipeline arithmetic code decoder which has a plurality of stages of pipelines, receives the predicted context index and the bitstream, executes a decoding process of the bitstream using the predicted context index, and generates and outputs a decoded symbol based on prediction;

a context index generator which includes a storage unit that receives and holds previous decoded symbols output before a decoded symbol at the present timing of the decoded symbols output from said pipeline arithmetic code decoder, receives the previous decoded symbols, the syntax element, and context information of the bitstream, and generates a correct context index required for decoding at the present timing;

a binarization table searcher which receives the syntax element, externally acquires a predetermined binarization table corresponding to a type of the syntax element, receives the decoded symbol at the present timing output from said pipeline arithmetic code decoder, searches the binarization table using the decoded symbol for a value of the syntax element, and outputs the value of the syntax element; and a prediction failure detector which receives the correct context index output from said context index generator and the predicted context index output from said context index predictor, compares the two context indices, and outputs a prediction failure signal when the two context indices do not match, wherein when the prediction failure signal is output, said pipeline arithmetic code decoder flashes the decoding process executed using the predicted context index, re-executes a decoding process using the correct context index, and outputs a correct decoded symbol.

According to one aspect of the present invention, there is provided an arithmetic code decoding method for generating a decoded symbol by decoding an input bitstream generated by encoding information, and outputting a value of a syntax element corresponding to the decoded symbol, comprising:

receiving the syntax element indicating a type of the information included in the bitstream, predicting a context index required to decode the bitstream, and generating the predicted context index;

receiving the predicted context index and the bitstream, executing a decoding process of the bitstream using the predicted context index, and generating and outputting a decoded symbol based on prediction;

receiving previous decoded symbols, which are output before a decoded symbol at the present timing of the decoded symbols, the syntax element, and context information of the bitstream, and generating a correct context index required for decoding at the present timing;

receiving the syntax element, externally acquiring a predetermined binarization table corresponding to a type of the syntax element, receiving the decoded symbol at the present timing, searching the binarization table using the decoded symbol for a value of the syntax element, and outputting the value of the syntax element; and receiving the correct context index and the predicted context index, comparing the two context indices, and outputting a prediction failure signal when the two context indices do not match, wherein when the prediction failure signal is output, the decoding process executed using the predicted context index is flashed, and a decoding process is redone using the correct context index to output a correct decoded symbol.

According to one aspect of the present invention, there is provided an arithmetic code decoding method for generating a decoded symbol by decoding an input bitstream generated by encoding information, and continuously outputting values of a plurality of syntax elements corresponding to the decoded symbol, comprising:

receiving the syntax element indicating a type of the information included in the bitstream, predicting a context index required to decode the bitstream, and generating the predicted context index;

receiving the predicted context index and the bitstream, executing a decoding process of the bitstream using the predicted context index, and generating and outputting a decoded symbol based on prediction;

receiving and holding the syntax elements, and sequentially outputting the held syntax elements;

receiving previous decoded symbols, which are output before a decoded symbol at the present timing of the decoded symbols output from the pipeline arithmetic code decoder, the syntax element, and context information of the bitstream, and generating a correct context index required for decoding at the present timing;

receiving the syntax element, externally acquiring a predetermined binarization table corresponding to a type of the syntax element, receiving the decoded symbols, searching the binarization table using the decoded symbols for values of the plurality of syntax elements, and outputting the values of the syntax elements;

receiving and holding the generated values of the syntax elements, and outputting the held values of the syntax elements; and comparing the correct context index and the predicted context index, and outputting a prediction failure signal when the two context indices do not match, wherein when the prediction failure signal is output, the decoding process executed using the predicted context index is flashed, and a decoding process using the correct context index is re-executed to output a correct decoded symbol.

BRIEF DESCRIPTION OF THE DRAWINGS

FIG. 5 is an explanatory view showing the sequence in which decoding is executed by four stages of pipelined parallel processes;

FIG. 6 is an explanatory view showing an example of a table used by a context index predictor in the first embodiment;

FIG. 7 is an explanatory view showing an example of a table used by the context index predictor;

FIG. 8 is an explanatory view showing pipeline stages in the arithmetic code decoding apparatus according to the first embodiment;

FIGS. 9A and 9B are explanatory views showing the processing contents in the pipeline stages;

FIG. 10 is an explanatory view showing the correspondence between the values of macroblock type syntax elements and binary data, which are used in the arithmetic code decoding apparatus according to the first embodiment;

DETAILED DESCRIPTION OF THE EMBODIMENTS

The embodiments of the present invention will be described hereinafter with reference to the accompanying drawings.

(1) First Embodiment

Figure 1:
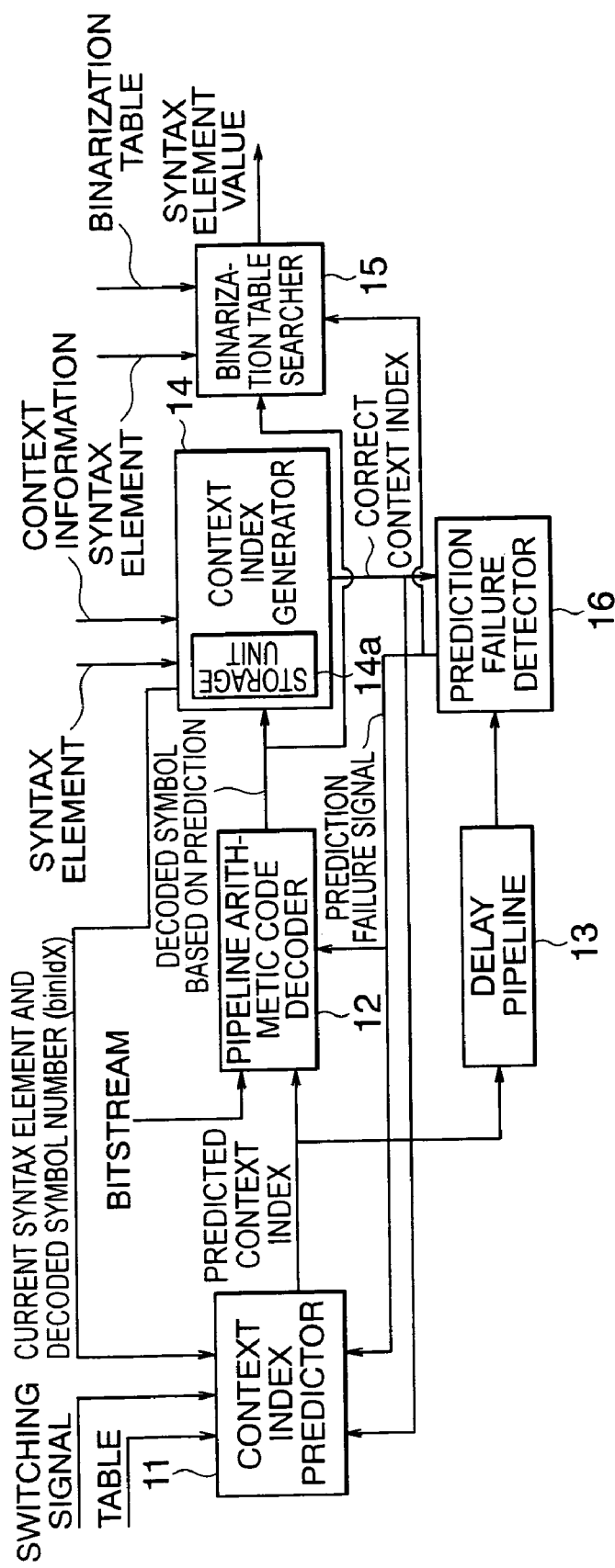
FIG. 1 is a block diagram showing the arrangement of an arithmetic code decoding apparatus according to the first embodiment of the present invention.
Figure 2:
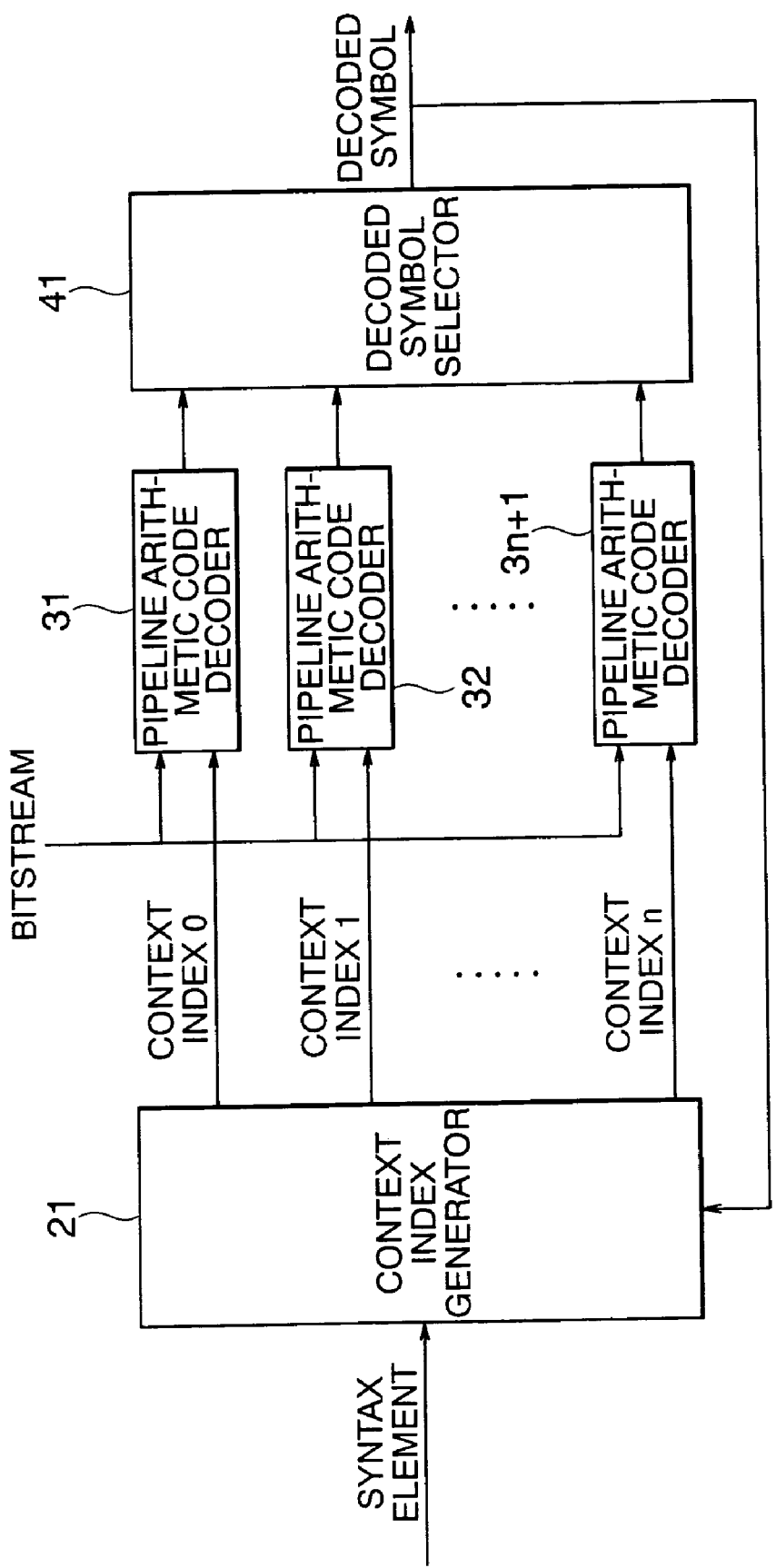
FIG. 2 is a block diagram showing the arrangement of an arithmetic code decoding apparatus according to a comparative example.

FIG. 1 shows the arrangement of an arithmetic code decoding apparatus according to the first embodiment, and FIG. 2 shows the arrangement of an arithmetic code decoding apparatus as a comparative example.

The apparatus as a comparative example comprises a context index generator 21, n (n is an integer equal to or larger than 2)+1 pipeline arithmetic code decoders 31, 32, . . . , $3_{n+1}$, and decoded symbol selector 41.

A syntax element is input to the context index generator 21. In a bitstream as encoded information, a sequence of information is specified based on syntax. The syntax element indicates the type of information allocated at a specific location. For example, when information associated with "color" is stored as the type of information at a given location on the basis of the syntax, the value of the syntax element indicates "red", "green", "blue", or the like in practice.

When such syntax element is input to the context index generator 21, n+1 context indices 0 to n are generated as all possible candidates. These context indices are required in the decoding process of a bitstream.

Each of the pipeline arithmetic code decoders 31 to $3_{n+1}$ independently has a plurality of stages of pipelines, and these decoders are arranged in parallel. An encoded bitstream is simultaneously input to the respective pipeline arithmetic code decoders 31 to $3_{n+1}$, and different context indices 0 to n are also input to them. The respective pipeline arithmetic code decoders 31 to $3_{n+1}$ execute decoding processes of the bitstream by a plurality of stages of pipelined parallel processes using context indices 0 to n, and output obtained decoded symbols to the decoded symbol selector 41.

The decoded symbol selector 41 adopts a symbol which is decoded using context index i (i is an integer from 0 to n), which is determined to be correct after the processes are executed in the respective pipeline arithmetic code decoders 31 to $3_{n+1}$, and externally outputs the adopted symbol.

However, with this arrangement, since decoding processes must be simultaneously executed using all possible context indices 0 to n, the circuit scale exponentially increases with increasing number of pipeline stages. More specifically, let k be the number of pipeline stages. Then, the apparatus must have 2E(k−2) pipeline arithmetic code decoders.

Figure 3:
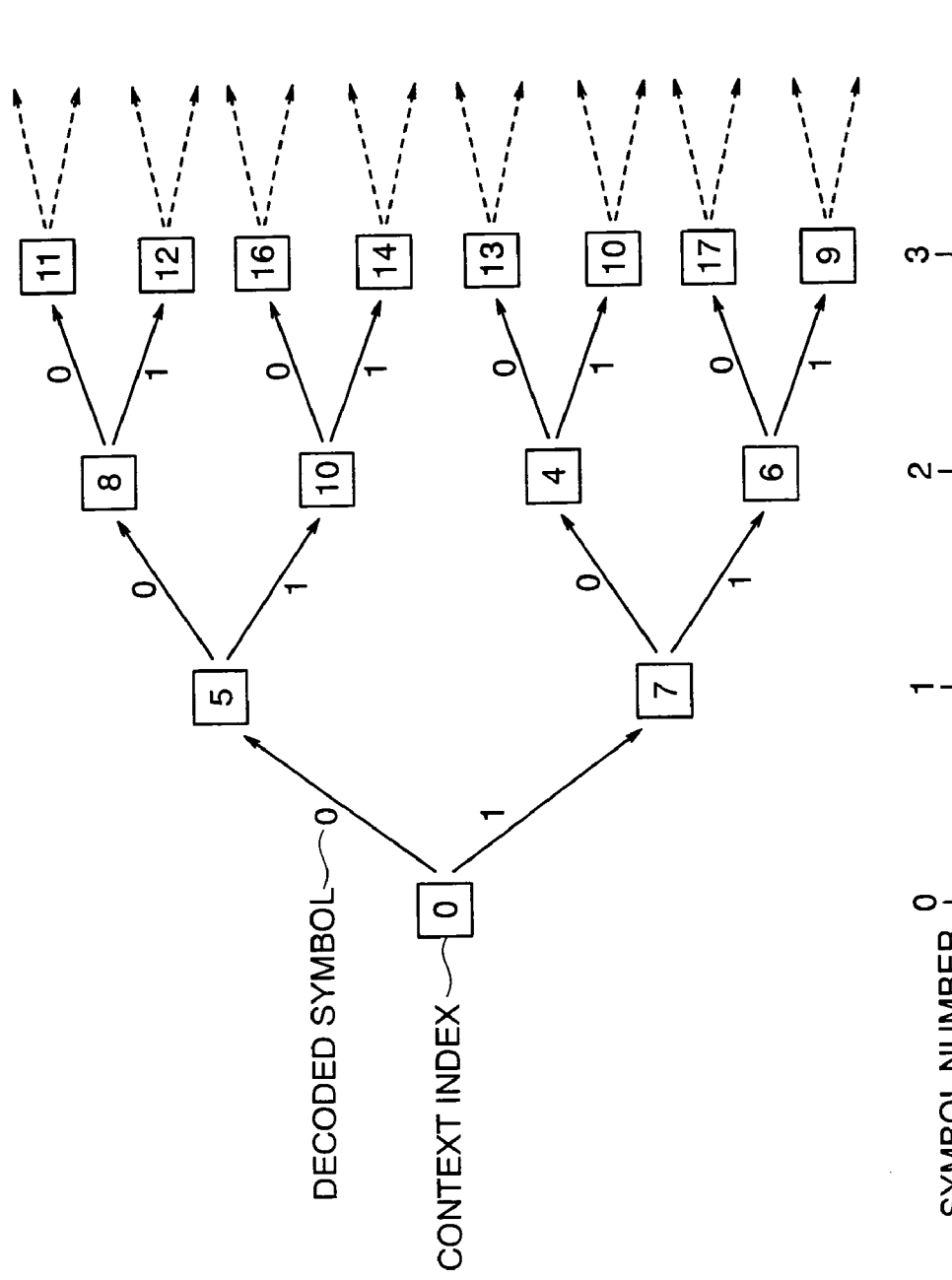
FIG. 3 is an explanatory view showing the sequence of a decoding process.

The decoding sequence using context indices will be explained below with reference to FIG. 3. As a result of decoding for the 0th symbol using a context index "0", there are two candidates of a decoded symbol to be obtained, i.e., "0" or "1".

If the decoding result is "0", the next 1st symbol is decoded using, e.g., a context index "5", and there are two candidates of a decoded symbol to be obtained, i.e., "0" or "1". Likewise, if the decoding result is "1", the next 1st symbol is decoded using, e.g., a context index "7", and there are two candidates of a decoded symbol to be obtained, i.e., "0" or "1". Therefore, there are four candidates of the decoding result to be obtained as a whole.

If the decoding result obtained using the context index "5" is "0", the next 2nd symbol is decoded using, e.g., a context index "8", and there are two candidates of a decoded symbol to be obtained, i.e., "0" or "1". If the decoding result obtained using the context index "5" is "1", the next 2nd symbol is decoded using, e.g., a context index "10", and there are two candidates of a decoded symbol to be obtained, i.e., "0" or "1". If the decoding result obtained using the context index "7" is "0", the next 2nd symbol is decoded using, e.g., a context index "4", and there are two candidates of a decoded symbol to be obtained, i.e., "0" or "1". If the decoding result obtained using the context index "7" is "1", the next 2nd symbol is decoded using, e.g., a context index "6", and there are two candidates of a decoded symbol to be obtained, i.e., "0" or "1". Therefore, there are eight candidates of the decoding result to be obtained as a whole.

Figure 4:
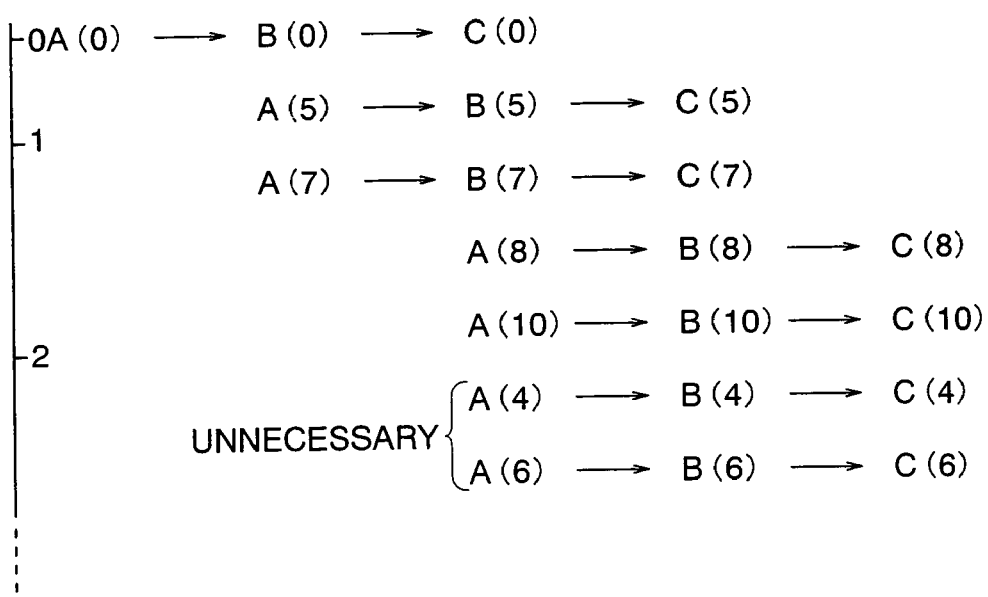
FIG. 4 is an explanatory view showing the sequence in which decoding is executed by three stages of pipelined parallel processes.

A case will be examined below wherein such decoding is done by three stages of pipelined parallel processes, as shown in, e.g., FIG. 4.

A decoding process is executed for the 0th symbol in steps A, B, and C using a context index "0", and upon completion of step C, a decoded symbol "0" or "1" is output as the decoding result.

Unless the decoding result of this 0th symbol is "0" or "1" is settled, whether a context index required to decode the next 1st symbol is "5" or "7" cannot be settled.

However, in order to execute pipeline processes, processes must be parallelly executed for these two candidates. That is, a decoding process is executed for the 1st symbol in steps A, B, and C using a context index "5", and a decoded symbol "0" or "1" is output as the decoding result. Likewise, a decoding process is executed for the 1st symbol in steps A, B, and C using a context index "7", and a decoded symbol "0" or "1" is output as the decoding result.

Upon decoding the 2nd symbol, since the decoding result of the 0th symbol is output, the context index to be used upon decoding the 1st symbol is determined. Assume that the decoding result of the 0th symbol is "0", and the context index to be used upon decoding the 1st symbol is "5". In this case, a context index required to decode the 2nd symbol is limited to either of "8" and "10", and "4" and "6" are excluded.

Therefore, when the number k of pipeline stages=3, 2E(3−2), i.e., two pipeline arithmetic code decoders must be equipped.

Likewise, as shown in, e.g., FIG. 5, four stages of pipelined parallel processes are executed as follows.

A decoding process is executed for the 0th symbol in steps A, B, C, and D using a context index "0". Upon completion of step D, a decoded symbol "0" or "1" is output as the decoding result.

A decoding process is executed for the 1st symbol in steps A, B, C, and D using a context index "5", and a decoded symbol "0" or "1" is output as the decoding result. Also, a decoding process is executed for the 1st symbol in steps A, B, C, and D using a context index "7", and a decoded symbol "0" or "1" is output as the decoding result.

Upon decoding the 2nd symbol, the decoding result of the 0th symbol is not settled yet. Therefore, decoding processes must be parallelly executed for all four candidates.

Decoding processes are executed for the 2nd symbol respectively using context indices "8", "10", "4", and "6", and decoded symbols "0" or "1" are output as decoding results, i.e., a total of eight different results are output.

Upon decoding the 3rd symbol, the decoding result of the 0th symbol is output, and the context index to be used upon decoding the 1st symbol is determined. Assume that the decoding result of the 0th symbol is "0", and the context index upon decoding the 1st symbol is "5". In this case, a context index required to decode the 2nd symbol is limited to either of "8" and "10", and "4" and "6" are excluded. Furthermore, a context index required to decode the 3rd symbol is limited to one of "11", "12", "16", and "14", and "13", "10", "17", and "9" are excluded.

Therefore, when the number k of pipeline stages=4, 2E(4−2), i.e., four pipeline arithmetic code decoders must be equipped.

By contrast, an arithmetic code decoding apparatus according to the first embodiment comprises a context index predictor 11, a context index generator 14 including a storage unit 14a, a binarization table searcher 15, a prediction failure detector 16, and a delay pipeline 13, as shown in FIG. 1, and also one pipeline arithmetic code decoder 12 irrespective of the number of pipeline stages.

The context index predictor 11 connected before the pipeline arithmetic code decoder 12 receives a current syntax element required for prediction from the context index generator 14, and also a table required for prediction from a CPU or the like (not shown). If a plurality of prediction methods are available and, especially, if a plurality of tables are available, a switching signal that instructs a prediction method to be used is input from the CPU or the like.

Furthermore, the context index generator 14 preferably inputs a decoding symbol number (binIdx) in addition to the current syntax element, but this number is not always indispensable information. The decoding symbol number (binIdx) indicates the number of a decoded symbol sequentially output from the pipeline arithmetic code decoder 12, and can be used to detect a stage of prediction.

FIG. 6 shows an example of a table used to predict a context index. FIG. 6 shows the correspondence between context indices output one cycle before, and those which are to be predicted for the current syntax element. For example, when the context index output one cycle before is "3", the context index to be predicted currently is "4"; when the context index output one cycle before is "5", the context index to be predicted currently is "10".

This table indicates transition of context indices, and may be generated using a statistical method on the basis of previous histories associated with context indices.

FIG. 7 shows another example of a table used to predict a context index. FIG. 7 shows the correspondence among the current syntax elements, the decoding symbol numbers (binIdx) output from the pipeline arithmetic code decoder 12 at the present time, and context indices to be predicted. For example, when the current syntax element is "0", and the decoding symbol number (binIdx) is "3", the context index to be currently predicted is "4". Likewise, when the current syntax element is "1", and the decoding symbol number (binIdx) is "2", the context index to be currently predicted is "7".

In this case, the pipeline arithmetic code decoder 12 inputs the current syntax element and decoding symbol number (binIdx).

If two or more different tables are given, a switching signal indicating a table to be used is supplied from the CPU or the like (not shown). This switching signal instructs the prediction method and table to be used.

Using such prediction method, the context index predictor 11 predicts and outputs one of a plurality of possible context indices.

The output context index is supplied to the pipeline arithmetic code decoder 12. Also, the output context index is delayed a time corresponding to the number of pipeline stages via the delay pipeline 13, and is then supplied to the prediction failure detector 16.

The pipeline arithmetic code decoder 12 receives a bitstream as encoded information, speculatively decodes it using the predicted context index on the basis of the probability of a prediction failure, and outputs a decoded symbol based on prediction.

The context index generator 14 connected after the pipeline arithmetic code decoder 12 receives the decoded symbol based on prediction, which is output from the pipeline arithmetic code decoder 12, the syntax element, and context information, as information required to generate a correct context index.

The context index generator 14 stores decoded symbols input from the pipeline arithmetic code decoder 12 in the storage unit 14a. In order to generate a context index, all previous decoded symbols from the time (i−1) one symbol before the decoded symbol which is decoded at the current time (i) until the start time (0) are required.

The context information is supplied from software to the context index generator 14, and is associated with a context of information to be currently decoded. For example, upon decoding image information of a given place, the context information indicates image information at a place around that place.

Using such information, the context index generator 14 generates a correct context index, and supplies it to the prediction failure detector 16 and the context index predictor 11, which uses that context index to predict the next context index.

The binarization table searcher 15 receives the syntax element, a predetermined binarization table corresponding to the type of this syntax element, and the decoded symbol based on prediction, which is output from the pipeline arithmetic code decoder 12.

The binarization table stores decoded symbol sequences, each of which is formed by setting a plurality of bits of decoded symbols in a sequence, and syntax element values to have one-to-one correspondence, as will be described later. This binarization table is searched using a decoded symbol sequence to obtain the syntax element value.

The prediction failure detector 16 compares the correct context index output from the context index generator 14 with the predicted context index to be compared, which is input via the delay pipeline 13, and detects whether or not the prediction has succeeded.

If the two indices do not match, it is determined that the prediction of the context index has failed. In this case, the prediction failure detector 16 outputs a prediction failure signal, which is supplied to the binarization table searcher 15, pipeline arithmetic code decoder 12, and context index predictor 11.

When the prediction failure detector 16 does not detect any failure of prediction done by the context index predictor 11, it is determined that the decoded symbol based on prediction, which is supplied from the pipeline arithmetic code decoder 12 is correct, and the obtained syntax element value is output as a final decoding result.

Upon reception of the prediction failure signal, the context index predictor 11 redoes prediction of a context index. More specifically, the predictor 11 outputs the correct context index supplied from the context index generator 14 as a predicted context index.

Upon reception of the prediction failure signal, the pipeline arithmetic code decoder 12 flashes pipeline processes from the decoding process which was done using the wrong predicted context index up to subsequent processes, and redoes the decoding processes using the correct context index supplied from the context index predictor 11.

Upon reception of the prediction failure signal, the context index generator 14 flashes decoded symbols based on wrong prediction, which are supplied from the pipeline arithmetic code decoder 12, and receives and stores a correct decoded symbol in the storage unit 14a, which is recalculated using the correct context index, and is used to generate the next context index.

Upon reception of the prediction failure signal, the binarization table searcher 15 flashes search processes using the decoded symbols based on wrong prediction, which are supplied from the pipeline arithmetic code decoder 12. The searcher 15 receives a correct decoded symbol which is recalculated using the correct context index, searches the binarization table using this symbol, and outputs a correct syntax element value.

The flow of the prediction processes in the context index predictor 11, the pipeline processes in the pipeline arithmetic code decoder 12, the failure detection processes in the prediction failure detector 16, and the output processes in the context index generator 14 and binarization table searcher 15 will be explained below using FIG. 8.

Assume that the number of pipeline stages of the pipeline arithmetic code decoder 12 is 5, that of the context index predictor 11 is 1, and that of the context index generator 14 is 1.

Assume that symbol numbers 0, 1, 2, 3, . . . are assigned to symbols to be decoded, as indicated by the ordinate in FIG. 8, and the processes progress in turn along cycles 0, 1, 2, 3, . . . on the abscissa.

Also, the meanings of symbols P, AD, RC, and O, and hatching used in FIG. 8 are, as shown in FIGS. 9A and 9B.

In this case, a process for decoding an arithmetic code for one arbitrary symbol includes a total of eight stages as follows.

(1) P(i) stage in which the context index predictor 11 predicts a context index for the i-th symbol (2) five stages, i.e., AD0(i) to AD4(i) stages in which the pipeline arithmetic code decoder 12 decodes an arithmetic code for the i-th symbol using the predicted context index (3) The context index generator 14 calculates a correct context index for the i-th symbol using the output result of O(i−1) stage. Note that no output result of the previous stage is present for the 0th symbol, and such stage is not required. For the 1st and subsequent symbols, the output results of the previous stages are used. RC(i) stage in which the prediction failure detector 16 compares the correct context index with the predicted context index to check if the predicted context index is correct (4) O(i) stage in which the binarization table searcher 14 outputs a syntax element value as the decoding result of the correct symbol for the i-th symbol The flow of the processes executed for the 0th symbol will be described first using FIG. 8. An original process starts from cycle 1, and processes in cycle 0 are done for values present in an initial stage and are insignificant. For example, the prediction failure detector 16 detects if the context index predicted by the context index predictor 11 for the 0th symbol is correct. However, prediction of a context index for the 0th symbol is done in the 7th cycle. Hence, the output from the context index predictor 11 in cycle 0 is insignificant, and the detection result of the prediction failure detector 16 in this stage indicates a prediction failure.

In cycle 1, the context index predictor 11 predicts a context index for the 0th symbol as P(0) stage.

In cycles 2 to 6, the pipeline arithmetic code decoder 12 executes a decoding process of an arithmetic code using the predicted context index for the 0th symbol as AD0(0) to AD4(0) stages including five stages of pipelines.

In cycle 7, the context index generator 14 generates a correct context index for the 0th symbol as RC(0) stage. The prediction failure detector 16 compares this correct context index with the context index, which was predicted in cycle 1 and is input after it is delayed for six cycles via the delay pipeline 13 to detect if the predicted context index is correct.

In this case, since it is determined that the predicted context index is correct, the binarization table searcher 15 outputs a syntax element value as the decoding result for the 0th symbol as O(0) stage in the next cycle 8.

Because of the pipeline processes, a process for decoding the next 1st symbol starts from stage 2.

In cycle 2, the context index predictor 11 predicts a context index for the 1st symbol as P(1) stage.

In cycles 3 to 7, the pipeline arithmetic code decoder 12 executes a decoding process of an arithmetic code using the predicted context index for the 1st symbol as AD0(1) to AD4(1) stages.

In cycle 8, the context index generator 14 generates a correct context index using output O(0) from the final stage of the previous pipeline for the 1st symbol as RC(1) stage. The prediction failure detector 16 compares this correct context index with the context index which was predicted in cycle 2 and is input after it is delayed for six cycles by the delay pipeline 13 to detect if the predicted context index is correct.

In this case, since it is determined that the predicted context index is correct, the binarization table searcher 15 outputs a syntax element value as the decoding result for the 1st symbol as O(1) stage in the next cycle 9.

A process for decoding the next 2nd symbol starts from stage 3. In cycle 3, the context index is predicted as P(2) stage.

In cycles 4 to 8, a decoding process of an arithmetic code is executed using the predicted context index as AD0(2) to AD4(2) stages.

In cycle 9, a correct context index is generated using output O(1) from the final stage of the previous pipeline as RC(2) stage. This correct context index is compared with the context index predicted in cycle 3 via the delay pipeline 13 to detect if the predicted context index is correct.

In this case, since it is determined that the predicted context index is correct, the decoding result for the 2nd symbol is output as O(2) stage in cycle 10.

Furthermore, a process for decoding the next 3rd symbol starts from stage 4. In cycle 4, a context index is predicted as P(3) stage.

In cycles 5 to 9, a decoding process of an arithmetic code is executed using the predicted context index as AD0(3) to AD4(3) stages.

In cycle 10, a correct context index is generated using output O(2) from the final stage of the previous pipeline as RC(3) stage. This correct context index is compared with the context index predicted in cycle 4 via the delay pipeline 13 to detect if the predicted context index is correct.

In this case, assume that the predicted context index does not match the correct context index, and it is determined that the predicted context index is incorrect.

All processes executed for the 3rd and subsequent symbols from cycle 4 to cycle 9 are flashed to redo these processes in cycle 11 and subsequent cycles.

For the 3rd symbol, the context index predictor 11 receives a correct context index from the context index generator 14 and outputs it as a predicted context index in cycle 11 as P(3) stage.

In cycles 12 to 16, a decoding process of an arithmetic code is done using the correct context index as AD0(3) to AD4(3) stages.

In cycle 17, the correct context index is compared with the context index which is recalculated in cycle 11 and is input via the delay pipeline 13 as RC(3) stage to detect if the predicted context index is correct. In this case, since the two indices match and the predicted context index is correct, the decoding result for the 3rd symbol is output as O(3) stage in the next cycle 18.

Since the predicted context index does not match the correct context index, and it is detected that the predicted context index is incorrect as RC(3) stage in cycle 10, processes for the 4th to 9th symbols that have been parallelly done until this cycle 10 are flashed, and must be redone from P(4) to P(9) prediction stages.

Taking the 4th symbol as an example, its process restarts from cycle 12, and a correct context index is given and is output as a predicted context index as P(4) stage.

After that, in cycles 13 to 17, a decoding process of an arithmetic code is executed using the correct context index as AD0(4) to AD4(4) stages.

In cycle 18, the correct context index is compared with the context index which was recalculated in cycle 12 via the delay pipeline 13 to detect if the predicted context index is correct. In this case, since the two indices match and the predicted context index is correct, the decoding result for the 4th symbol is output as O(4) stage in the next cycle 19.

Likewise, a process for the 5th symbol restarts from cycle 13, and a correct context index is given and is output as a predicted context index as P(5) stage.

After that, in cycles 14 to 18, a decoding process of an arithmetic code is executed using the correct context index as AD0(5) to AD4(5) stages.

In cycle 19, the correct context index is compared with the context index which was recalculated in cycle 13 via the delay pipeline 13 to detect if the predicted context index is correct. In this case, since the two indices match and the predicted context index is correct, the decoding result for the 4th symbol is output as O(5) stage in the next cycle 20.

A sequence executed when the pipeline arithmetic code decoder 12 executes a decoding process of a bitstream using context indices to generate decoded symbols, and the binarization table searcher 15 searches the binarization table using decoded symbols as binary data to obtain syntax element values will be explained below.

In the decoding process, a process for extracting information corresponding to a syntax element from a bitstream as a syntax element value is executed.

In the standard "H.264 Main Profile", syntax element values (Syntax Element) and decoded symbol sequences (bin Strings) are associated with each other via a binarization table depending on the types of syntax elements.

FIG. 10 shows a binarization table in which syntax element values for the macroblock type as an example of a syntax element are associated with bit strings b(0) to b(25) as binarized data.

In an encoding process, a process for binarizing the value of a given syntax element for each symbol is executed. For example, a syntax element value "5" is encoded to a bit string "1001000" as binary data. After conversion into such binary data, arithmetic coding is done to generate a bitstream.

In the decoding process, conversely, every time one symbol is decoded, the bitstream undergoes arithmetic coding to be converted into bit strings b(0) to b(25) as binary data, and the binarization table is searched for syntax element values corresponding to these bit strings b(0) to b(25).

In arithmetic coding and decoding, a context index is used as information required for the processes, as described above. This context index is determined by a syntax element, context information, and a result obtained by encoding or decoding a symbol with the immediately preceding number, as described above.

Therefore, information required for the decoding process includes a bitstream, syntax element, and context information, and output information is a syntax element value.

A sequence for obtaining a syntax element value based on given binary data, which is specified by the standard "H.264 Main Profile", will be described below using the flowchart of FIG. 11.

In step S11, a syntax element of a bitstream to be decoded is externally input. As a result, it is determined that the type of the syntax element is, e.g., the macroblock type.

In step S12, a binarization table corresponding to this syntax element type is externally acquired. This binarization table is determined in advance for each syntax element type, and the binarization table for the microblock type shown in FIG. 10 will be taken as an example in the following description.

In step S13, "−1" is set as an initial value of variable binIdx so as to obtain bin strings as binarization data for respective variables 0 to n indicating bit positions.

In step S14, the value of variable binIdx is incremented by "1".

In step S15, a context index determined by the syntax element, context information, and previously encoded decoded symbols b(0) to b(binIdx−1) at a bit position (binIdx) at that time, i.e., bit "0" initially, is obtained.

In step S16, decoded symbol b(binIdx) at the bit position (binIdx) of interest is decoded from the bitstream using the obtained context index.

In step S17, the binarization table acquired in step S12 is searched for a syntax element value corresponding to decoded symbol data b(0) to b(binIdx) from the first bit position "0" to the bit position (binIdx) of interest. Before one syntax element value is determined, the flow returns to step S14 to repeat the processes in steps S15 to S17. After one syntax element value is determined, that value is output, and the flow advances to step S18, thus ending the process.

For example, at a stage when "1" is obtained as binary data at bit position "0", one of syntax element values cannot be determined.

Next, even at a stage when "0" is obtained as binary data at bit position "1", a syntax element value cannot be determined.

In this manner, when binary data at bit positions "2", "3", . . . are obtained in turn, and binary data "1001101" at bit positions "0" to "6" are obtained, "10" is determined as one syntax element value.

In this fashion, in the decoding process, a syntax element value corresponding to the syntax element is extracted from a bitstream.

According to this embodiment, upon implementing the decoding process as pipelined parallel processes, a context index is predicted from a syntax element, and decoding is done using the predicted context index. If a prediction failure has occurred, pipeline processes executed so far are flashed. Unlike in a case wherein decoding is done using all possible context indices, an increase in circuit scale can be suppressed even when the number of pipeline stages increases, thus allowing a cost reduction.

(2) Second Embodiment

Figure 12:
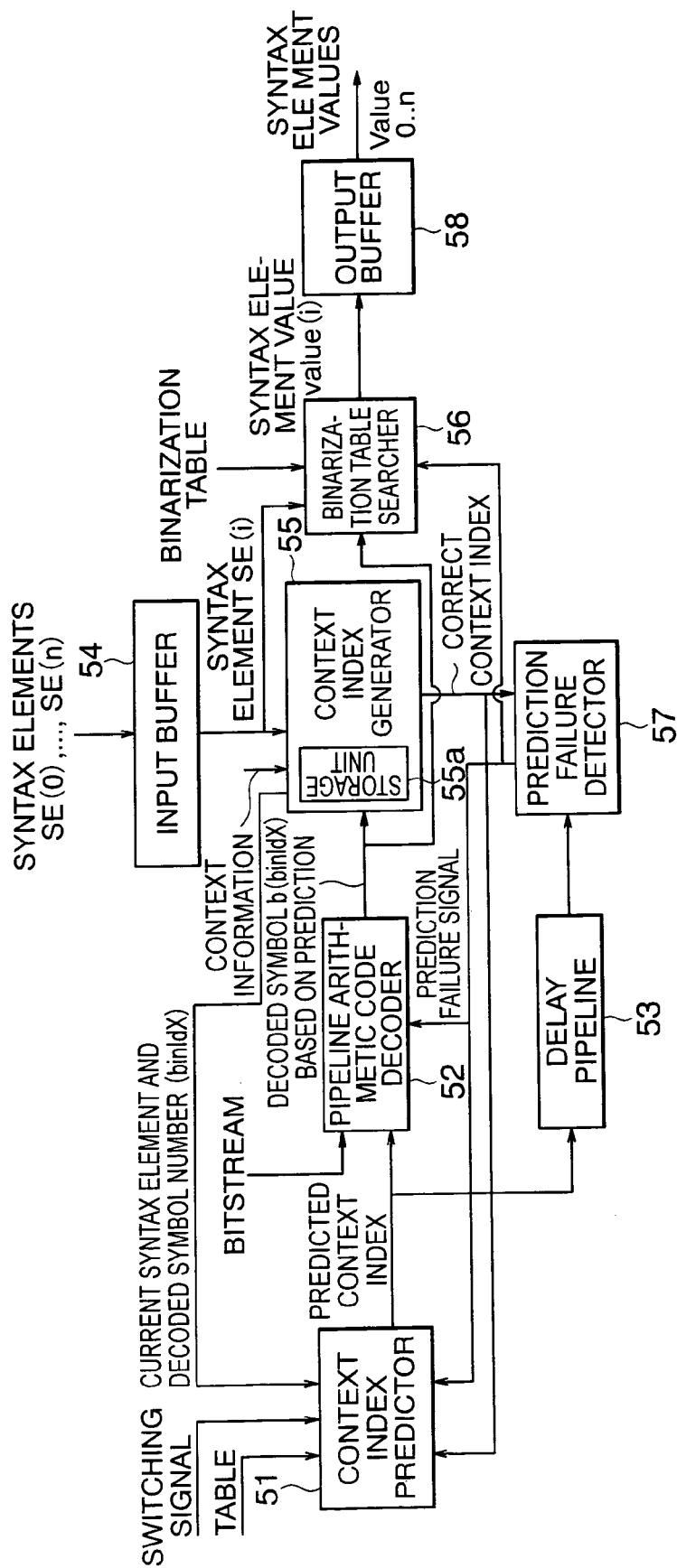
FIG. 12 is a block diagram showing the arrangement of an arithmetic code decoding apparatus according to the second embodiment of the present invention.

FIG. 12 shows the arrangement of an arithmetic code decoding apparatus according to the second embodiment of the present invention.

The arithmetic code decoding apparatus according to this embodiment comprises a context index predictor 51, pipeline arithmetic code decoder 52, delay pipeline 53, input buffer 54, context index generator 55, binarization table searcher 56, prediction failure detector 57, and output buffer 58.

As in the first embodiment, the context index predictor 51 that predicts a context index is connected before the pipeline arithmetic code decoder 52.

The context index generator 55 that generates a correct index on the basis of the history of previous decoded symbols stored in a storage unit 55a, and the binarization table searcher 56 which searches a binarization table for a syntax element value corresponding to a decoded symbol sequence are connected after the pipeline arithmetic code decoder 52.

The prediction failure detector 57 that compares the context index predicted by the context index predictor 51 with the correct context index generated by the context index generator 55 and outputs a prediction failure signal when they do not match is connected after the pipeline arithmetic code decoder 52. When the prediction failure signal is output, the pipeline arithmetic code decoder 52 flashes the decoding processes using this predicted context index, and redoes processes using the correct context index.

Furthermore, in this embodiment, the input buffer 54 is connected so as to temporarily hold a plurality of syntax elements SE(0), SE(1), . . . , SE(n) and to input them to the context index generator 55 and binarization table searcher 56 at required timings. Also, the output buffer 58 which temporarily holds a plurality of syntax element values value(0), value(1), . . . , value(n), which are sequentially output from the binarization table searcher 56, and outputs them at required timings, is connected. Each of the input buffer 54 and output buffer 58 comprises, e.g., a FIFO (First-In First-Out) buffer.

The operations of the context index predictor 51, pipeline arithmetic code decoder 52, delay pipeline 53, context index generator 55, binarization table searcher 56, and prediction failure detector 57 are the same as those of the context index predictor 11, pipeline arithmetic code decoder 12, delay pipeline 13, context index generator 14, binarization table searcher 15, and prediction failure detector 16, and a description thereof will be omitted.

Figure 13:
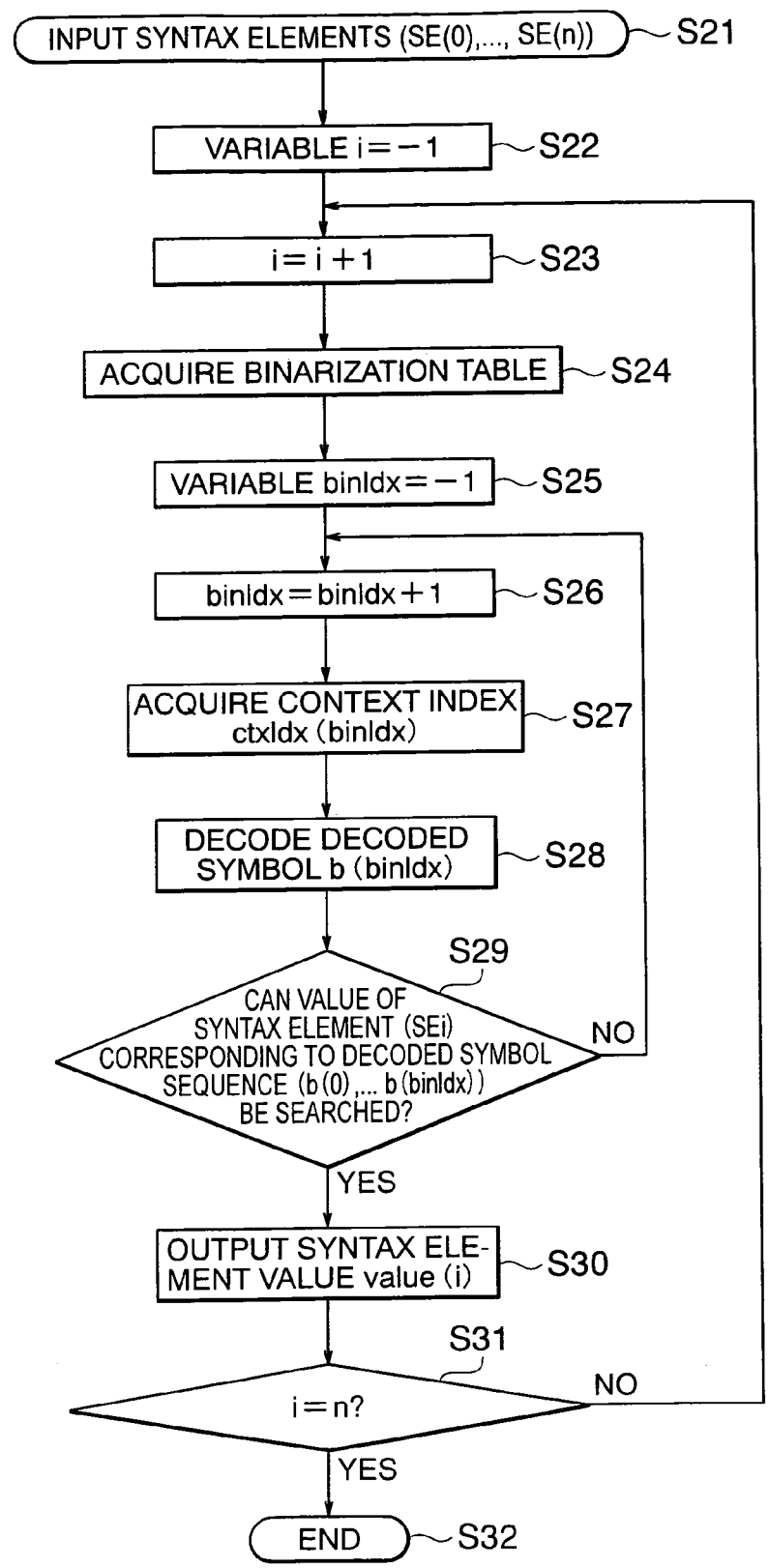
FIG. 13 is a flowchart showing the sequence for successively executing a decoding process of context-based adaptive arithmetic codes in the arithmetic code decoding apparatus according to the second embodiment.

A sequence of processes for extracting syntax element values corresponding to a plurality of syntax elements SE(0), SE(1), . . . , SE(n) from a bitstream, and continuously decoding and outputting them in this embodiment will be described below with reference to the flowchart of FIG. 13.

In step S21, syntax elements SE(0), SE(1), . . . , SE(n) to be decoded are externally supplied to the context index generator 55 and binarization table searcher 56 via the input buffer 54. As a result, it is determined that the type of the syntax element is, e.g., the macroblock type.

In step S22, "−1" is set as an initial value of variable i so as to obtain a syntax element value for each of the plurality of syntax elements SE(0), SE(1), . . . , SE(n).

In step S23, the value of variable i is incremented by "1".

In step S24, a binarization table corresponding to this syntax element type is acquired.

In step S25, "−1" is set as an initial value of variable binIdx so as to obtain bin strings as binarization data for respective variables 0 to n indicating bit positions.

In step S26, the value of variable binIdx is incremented by "1".

In step S27, a context index determined by syntax element SE(i), context information, and previously decoded symbols b(0) to b(binIdx−1) at a bit position (binIdx) at that time, i.e., bit "0" initially, is obtained.

In step S28, decoded symbol b(binIdx) at the bit position (binIdx) of interest is decoded from the bitstream using the obtained context index.

In step S29, the binarization table acquired in step S24 is searched for syntax element value value (i) corresponding to decoded symbol data b(0) to b(binIdx) from the first bit position "0" to the bit position (binIdx) of interest. Before one syntax element value is determined, the flow returns to step S26 to repeat the processes in steps S27 to S29. After one syntax element value is determined, that value is output.

Figure 11:
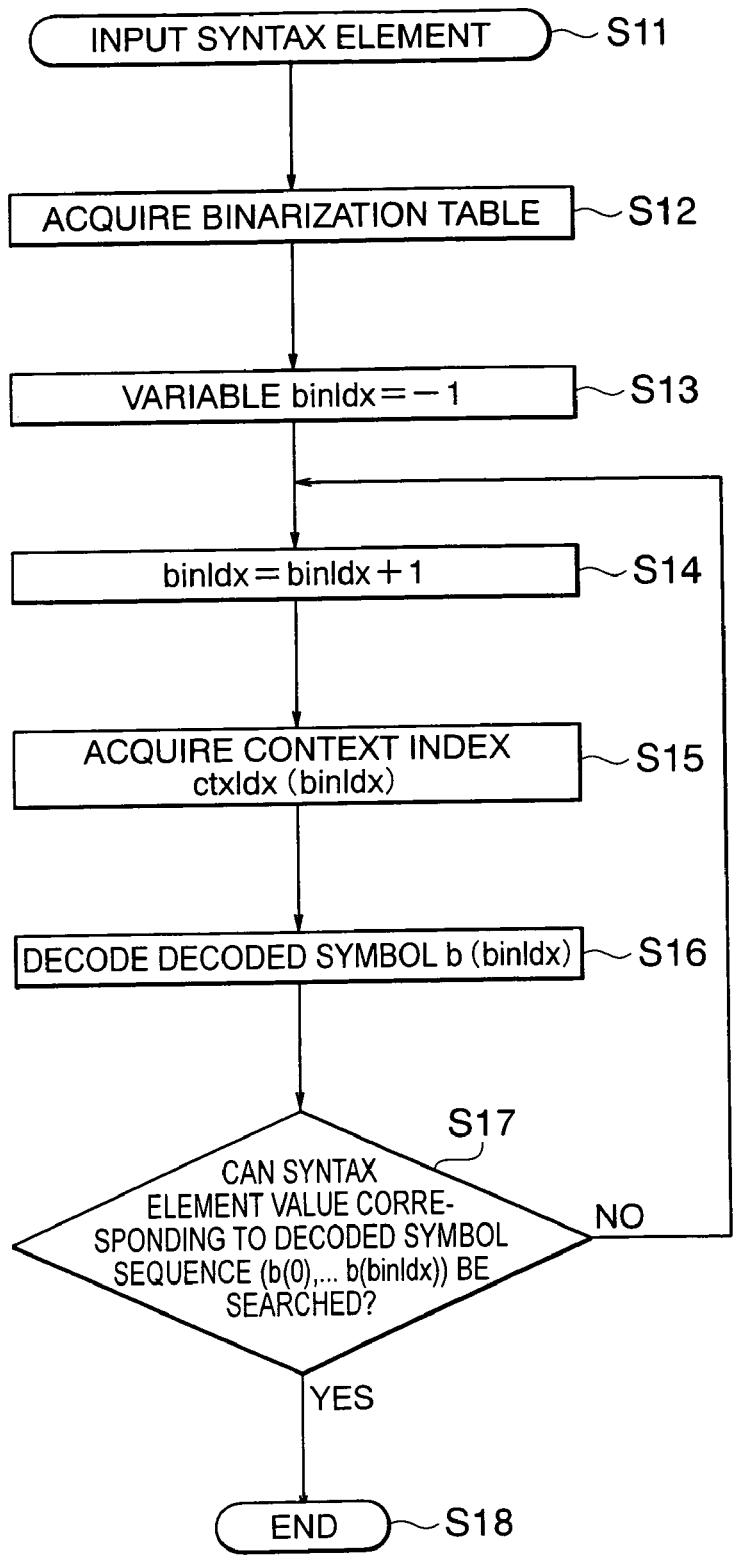
FIG. 11 is a flowchart showing the decoding sequence of context-based adaptive arithmetic codes in the arithmetic code decoding apparatus according to the first embodiment.

The processes in steps S24 to S29 are the same as those in steps S12 to S17 in FIG. 11 in the first embodiment.

In step S30, syntax element value value(i) obtained by the search process in step S29 is stored in the output buffer 58.

If it is determined in step S31 that the processes are complete for all syntax elements SE(i) (i=n), the flow advances to step S32 to end the process. If syntax elements SE(i) to be processed still remain (i<n), the flow returns to step S23 to repeat the same processes.

The arithmetic code decoding process executed in step S28 normally requires a plurality of steps, as described above. In this case, the processes can be speeded up by pipelined parallel processes. However, in order to attain such processes, context indices must be continuously supplied to the pipeline arithmetic code decoder 52.

The context index required for the decoding process in step S28 is obtained in step S27. Upon obtaining this context index, decoded symbol b(binIdx−1) as a result of the decoding process in the next step S28 is required.

Also, different syntax element SE(i) is given depending on whether the control branches to step S26 or S30 from step S29. For this reason, in order to obtain a context index, information indicating the branch destination is also required.

Therefore, a normal pipelined parallel processing mechanism cannot be directly applied to the arithmetic code decoding process specified by "H.264 Main Profile".

In this embodiment, as described above, the context index predictor 51 predicts a context index prior to settlement of decoded symbol b(binIdx−1), and inputs it to the pipeline arithmetic code decoder 52.

When decoded symbol b(binIdx−1) is settled, and a correct context index is obtained, if the predicted context index is different from the correct context index as a result of comparison, pipelined decoding processes executed so far based on the wrong prediction result are flashed and redone.

In this manner, according to this embodiment, since the decoding process can be executed by continuously predicting and inputting context indices to the pipeline arithmetic code decoding apparatus before settlement of decoded symbol b(binIdx−1) in the pipeline arithmetic code decoder 12, high-speed decoding is assured while the context indices are predicted correctly.

Unlike in the prior art, since only one pipeline arithmetic code decoder is equipped irrespective of the number of pipeline stages of the arithmetic code decoder, an increase in circuit scale can be suppressed.

According to the arithmetic code decoding method and apparatus of the above embodiments, an increase in circuit scale can be suppressed and cost can be reduced even when the number of pipeline stages increases.

The aforementioned embodiments are merely examples and do not limit the present invention. For example, the binarization table shown in FIG. 10 is used when the syntax element type is the macroblock type. However, the present invention is not limited to such specific syntax element type, and can be applied to other types of syntax elements.

What is claimed is:

1. An arithmetic code decoding apparatus for generating a decoded symbol by decoding an input bitstream generated by encoding information, and outputting a value of a syntax element corresponding to the decoded symbol, comprising:

a context index predictor which receives the syntax element indicating a type of the information included in the bitstream, predicts a context index required to decode the bitstream, and outputs the predicted context index;

a pipeline arithmetic code decoder which has a plurality of stages of pipelines, receives the predicted context index and the bitstream, executes a decoding process of the bitstream using the predicted context index, and generates and outputs a decoded symbol based on prediction;

a context index generator which includes a storage unit that receives and holds previous decoded symbols output before a decoded symbol at the present timing of the decoded symbols output from said pipeline arithmetic code decoder, receives the previous decoded symbols, the syntax element, and context information of the bitstream, and generates a correct context index required for decoding at the present timing;

a binarization table searcher which receives the syntax element, externally acquires a predetermined binarization table corresponding to a type of the syntax element, receives the decoded symbol at the present timing output from said pipeline arithmetic code decoder, searches the binarization table using the decoded symbol for a value of the syntax element, and outputs the value of the syntax element; and a prediction failure detector which receives the correct context index output from said context index generator and the predicted context index output from said context index predictor, compares the two context indices, and outputs a prediction failure signal when the two context indices do not match, wherein when the prediction failure signal is output, said pipeline arithmetic code decoder flashes the decoding process executed using the predicted context index, re-executes a decoding process using the correct context index, and outputs a correct decoded symbol.

2. An apparatus according to claim 1, wherein said arithmetic code decoding apparatus continuously outputs values of a plurality of syntax elements corresponding to the decoded symbols, and said apparatus further comprises:

an input buffer for receiving and holding the syntax elements, and sequentially outputting the held syntax elements; and an output buffer for receiving and holding the values of the syntax elements output from said binarization table searcher, and outputting the held values of the syntax elements, whereby said context index generator and said binarization table searcher respectively receive the syntax elements output from said input buffer.

3. An apparatus according to claim 1, wherein said context index predictor receives a table which indicates correspondence between a context index output one cycle before and a context index to be predicted currently, and predicts and outputs the context index based on the table.

4. An apparatus according to claim 1, wherein said context index predictor receives a table which indicates correspondence among the syntax element, a decoded symbol number indicating an order of the decoded symbol output from said pipeline arithmetic code decoder, and a context index to be predicted currently, and predicts and outputs the context index based on the table.

5. An apparatus according to claim 1, wherein said context index predictor receives a first table which indicates correspondence between a context index output one cycle before and a context index to be predicted currently, a second table which indicates correspondence among the syntax element, a decoded symbol number indicating an order of the decoded symbol output from said pipeline arithmetic code decoder, and a context index to be predicted currently, and a switching signal designating one of the first and second tables to be used, and predicts and outputs the context index based on one of the first and second tables designated by the switching signal.

6. An apparatus according to claim 1, wherein said arithmetic code decoding apparatus further comprises a delay pipe line which receives the predicted context index output from the context index predictor, delays the predicted context index for time corresponding to the number of pipeline stages in said pipeline arithmetic code decoder, and outputs the delayed predicted context index to said prediction failure detector.

7. An apparatus according to claim 2, wherein said input buffer and output buffer are First-In First-Out buffers, respectively.

8. An arithmetic code decoding method for generating a decoded symbol by decoding an input bitstream generated by encoding information, and outputting a value of a syntax element corresponding to the decoded symbol, comprising:

receiving the syntax element indicating a type of the information included in the bitstream, predicting a context index required to decode the bitstream, and generating the predicted context index;

receiving the predicted context index and the bitstream, executing a decoding process of the bitstream using the predicted context index by a plurality of stages of pipelines, and generating and outputting a decoded symbol based on prediction;

receiving previous decoded symbols, which are output before a decoded symbol at the present timing of the decoded symbols, the syntax element, and context information of the bitstream, and generating a correct context index required for decoding at the present timing;

receiving the syntax element, externally acquiring a predetermined binarization table corresponding to a type of the syntax element, receiving the decoded symbol at the present timing, searching the binarization table using the decoded symbol for a value of the syntax element, and outputting the value of the syntax element; and receiving the correct context index and the predicted context index, comparing the two context indices, and outputting a prediction failure signal when the two context indices do not match, wherein when the prediction failure signal is output, the decoding process executed using the predicted context index is flashed, and a decoding process is redone using the correct context index to output a correct decoded symbol.

9. A method according to claim 8, wherein when the context index is predicted, the method includes, predicting the context index using a table which indicates correspondence between a context index output one cycle before and a context index to be predicted currently.

10. A method according to claim 8, wherein when the context index is predicted, the method includes, predicting the context index using a table which indicates correspondence among the syntax element, a decoded symbol number indicating an order of the decoded symbol, and a context index to be predicted currently.

11. A method according to claim 8, wherein when the context index is predicted, the method includes, receiving a first table which indicates correspondence between a context index output one cycle before and a context index to be predicted currently, a second table which indicates correspondence among the syntax element, a decoded symbol number indicating an order of the decoded symbol and a context index to be predicted currently, and a switching signal designating one of the first and second tables to be used, and predicting the context index based on one of the first and second tables designated by the switching signal.

12. A method according to claim 9, wherein when the predicted context index is generated, the predicted context index is delayed for time corresponding to the number of pipeline stages, and the delayed predicted context index and the correct context index are compared.

13. An arithmetic code decoding method for generating a decoded symbol by decoding an input bitstream generated by encoding information, and continuously outputting values of a plurality of syntax elements corresponding to the decoded symbol, comprising:

receiving the syntax element indicating a type of the information included in the bitstream, predicting a context index required to decode the bitstream, and generating the predicted context index;

receiving the predicted context index and the bitstream, executing a decoding process of the bitstream using the predicted context index by a plurality of stages of pipelines, and generating and outputting a decoded symbol based on prediction;

receiving and holding the syntax elements, and sequentially outputting the held syntax elements;

receiving previous decoded symbols, which are output before a decoded symbol at the present timing of the decoded symbols output from the pipeline arithmetic code decoder, the syntax element, and context information of the bitstream, and generating a correct context index required for decoding at the present timing;

receiving the syntax element, externally acquiring a predetermined binarization table corresponding to a type of the syntax element, receiving the decoded symbols, searching the binarization table using the decoded symbols for values of the plurality of syntax elements, and outputting the values of the syntax elements;

receiving and holding the generated values of the syntax elements, and outputting the held values of the syntax elements; and comparing the correct context index and the predicted context index, and outputting a prediction failure signal when the two context indices do not match, wherein when the prediction failure signal is output, the decoding process executed using the predicted context index is flashed, and a decoding process using the correct context index is re-executed to output a correct decoded symbol.

14. A method according to claim 13, wherein when the context index is predicted, the method includes, predicting the context index using a table which indicates correspondence between a context index output one cycle before and a context index to be predicted currently.

15. A method according to claim 13, wherein when the context index is predicted, the method includes, predicting the context index using a table which indicates correspondence among the syntax element, a decoded symbol number indicating an order of the decoded symbol, and a context index to be predicted currently.

16. A method according to claim 13, wherein when the context index is predicted, the method includes, receiving a first table which indicates correspondence between a context index output one cycle before and a context index to be predicted currently, a second table which indicates correspondence among the syntax element, a decoded symbol number indicating an order of the decoded symbol, and a context index to be predicted currently, and a switching signal designating one of the first and second tables to be used, and predicting the context index based on one of the first and second tables designated by the switching signal.

17. A method according to claim 9, wherein when the predicted context index is generated, the predicted context index is delayed for time corresponding to the number of pipeline stages, and the delayed predicted context index and the correct context index are compared.

* * * * *